(12) United States Patent
Itakura

(10) Patent No.: US 10,426,034 B2
(45) Date of Patent: Sep. 24, 2019

(54) CIRCUIT SUBSTRATE MODULE AND FLEXIBLE DISPLAY DEVICE

(71) Applicant: JOLED INC., Tokyo (JP)

(72) Inventor: Shunsuke Itakura, Tokyo (JP)

(73) Assignee: JOLED INC., Tokyo (JP)

( * ) Notice: Subject to any disclaimer, the term of this patent is extended or adjusted under 35 U.S.C. 154(b) by 119 days.

(21) Appl. No.: 15/719,811

(22) Filed: Sep. 29, 2017

(65) Prior Publication Data

US 2018/0103545 A1    Apr. 12, 2018

(30) Foreign Application Priority Data

Oct. 6, 2016 (JP) .................................. 2016-198539

(51) Int. Cl.

| H05K 1/14 | (2006.01) |
|---|---|
| H05K 1/18 | (2006.01) |
| G09G 3/3225 | (2016.01) |
| G09G 3/20 | (2006.01) |
| G06F 3/14 | (2006.01) |
| H01L 25/065 | (2006.01) |
| H01L 27/32 | (2006.01) |

(52) U.S. Cl.
CPC .............. *H05K 1/147* (2013.01); *G09G 3/20* (2013.01); *G09G 3/3225* (2013.01); *H05K 1/18* (2013.01); *G06F 3/1423* (2013.01); *G06F 3/1446* (2013.01); *G09G 2300/026* (2013.01); *G09G 2300/0426* (2013.01); *G09G 2380/02* (2013.01); *H01L 25/0655* (2013.01); *H01L 27/3244* (2013.01); *H05K 2201/09245* (2013.01); *H05K 2201/09945* (2013.01)

(58) Field of Classification Search
None
See application file for complete search history.

(56) References Cited

U.S. PATENT DOCUMENTS

| 2010/0177018 A1 | 7/2010 | Wang et al. |
| 2015/0370113 A1* | 12/2015 | Kim .................... G02F 1/13336 361/679.21 |

FOREIGN PATENT DOCUMENTS

| JP | 2003-316290 | 11/2003 |
| JP | 2006-309184 | 11/2006 |
| JP | 2010-160489 | 7/2010 |

* cited by examiner

*Primary Examiner* — Duane N Taylor, Jr.
(74) *Attorney, Agent, or Firm* — Greenblum & Bernstein, P.L.C.

(57) ABSTRACT

A circuit substrate module includes: a plurality of substrates which are arranged in a matrix, and on at least some of which circuit components are mounted; a plurality of first flexible substrates each of which is arranged between two adjacent substrates in a row direction among the plurality of substrates, and connects the two adjacent substrates; and a plurality of second flexible substrates each of which is arranged between two adjacent substrates in a column direction among the plurality of substrates, and connects the two adjacent substrates.

7 Claims, 4 Drawing Sheets

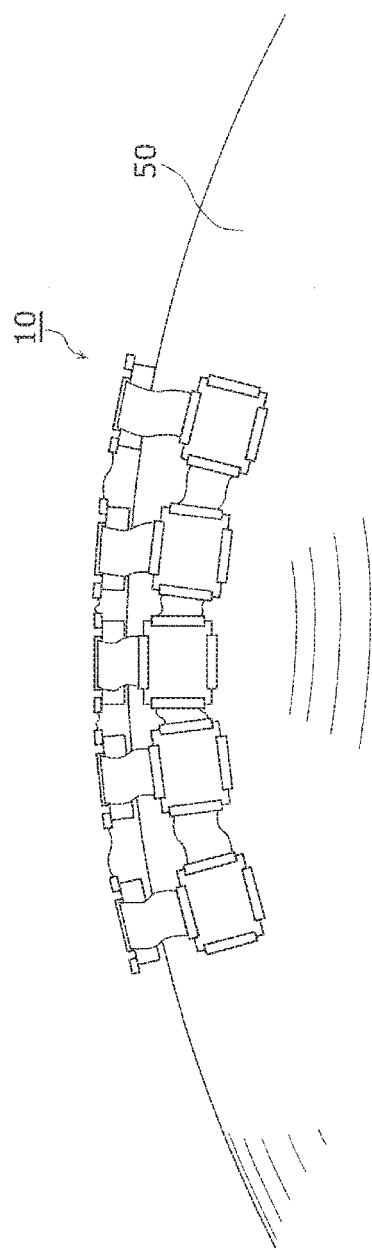

CIRCUIT SUBSTRATE MODULE AND FLEXIBLE DISPLAY DEVICE

CROSS REFERENCE TO RELATED APPLICATION

The present application is based on and claims priority of Japanese Patent Application No. 2016-198539 filed on Oct. 6, 2016. The entire disclosure of the above-identified application, including the specification, drawings and claims is incorporated herein by reference in its entirety.

FIELD

The present disclosure relates to a circuit substrate module and a flexible display device.

BACKGROUND

Recent years have seen active development of flexible display devices having a flexible display panel, using organic electro-luminescent (EL) elements etc. As disclosed in Patent Literature 1, there is a display device having a known configuration in which a display panel and a rigid substrate on which a driver circuit for the display panel is mounted are electrically connected using a flexible substrate on which an integrated circuit element for driving pixel circuits of the display panel is mounted.

CITATION LIST

Patent Literature

PTL 1 Japanese Unexamined Patent Application Publication No. 2006-309184

SUMMARY

Technical Problem

Although a flexible display panel can be disposed along a curved surface, it is difficult to dispose such a rigid substrate used as a substrate on which a driving circuit is mounted along the curved surface.

The present disclosure provides a circuit substrate module which can be disposed along a curved surface.

Solution to Problem

A circuit substrate module according to the present disclosure is a circuit substrate module, including: a plurality of substrates which are arranged in a matrix, and on at least some of which circuit components are mounted; a plurality of first flexible substrates each of which is arranged between two adjacent substrates in a row direction among the plurality of substrates, and connects the two adjacent substrates; and a plurality of second flexible substrates each of which is arranged between two adjacent substrates in a column direction among the plurality of substrates, and connects the two adjacent substrates, wherein, in each row of substrates among the plurality of substrates, a plurality of lines respectively provided to substrates in the row of substrates and a plurality of lines respectively provided to first flexible substrates which connect the substrates in the row of substrates form a first electric path which extends from a substrate located at a first end of the row of substrates to a substrate located at a second end of the row of substrates, and in each column of substrates among the plurality of substrates, a plurality of lines respectively provided to substrates in the column of substrates and a plurality of lines respectively provided to second flexible substrates which connect the substrates in the column of substrates form a second electric path which extends from a substrate located at a first end of the column of substrates to a substrate located at a second end of the column of substrates.

Advantageous Effects

The circuit substrate module according to the present disclosure can be disposed along a curved surface.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 illustrates the circuit substrate module disposed along a curved surface of a building.

DESCRIPTION OF EMBODIMENT

Figure 1A:
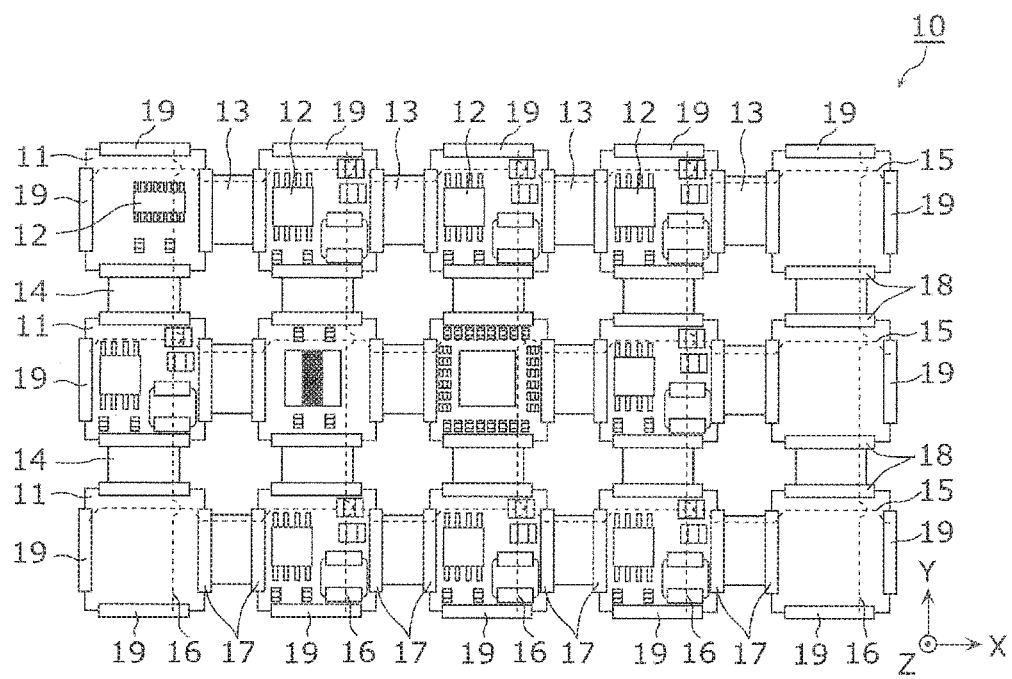
FIG. 1A is a plan view of a circuit substrate module according to an embodiment.

Hereinafter, an embodiment is described in detail referring to the drawings as necessary. It should be noted that unnecessarily detailed descriptions may be omitted below. For example, detailed descriptions about already well-known matters and overlapping descriptions for substantially the same configurations may be omitted. Such descriptions are omitted to prevent the descriptions below from being unnecessarily redundant and help a person skilled in the art to understand the present disclosure easily.

It should be noted that the attached drawings and descriptions below are provided so that any person skilled in the art to fully appreciate the present disclosure, without intending to limit the subject matters of the claims. The attached drawings are schematic diagrams and thus are not necessarily precise. Substantially the same elements are given the same numerical references in the drawings, and overlapping descriptions may be omitted or simplified.

In addition, in the drawings used to illustrate the embodiment below, coordinate axes may be indicated. In the direction of Z axis among the coordinate axes is a direction in which substrates are stacked (the height direction), and the positive side of the Z axis is represented as an upper side (upward) and the negative side of the Z axis is represented as a lower side (downward). Here, the X-axis direction and the Y-axis direction are orthogonal to each other on a plane (horizontal plane) perpendicular to the Z-axis direction. The X-axis direction is also described as a row direction. The Y-axis direction is also described as a column direction. For example, in the embodiment, "plan-view shape" is a shape when seen in the Z-axis direction.

EMBODIMENT

Figure 1B:
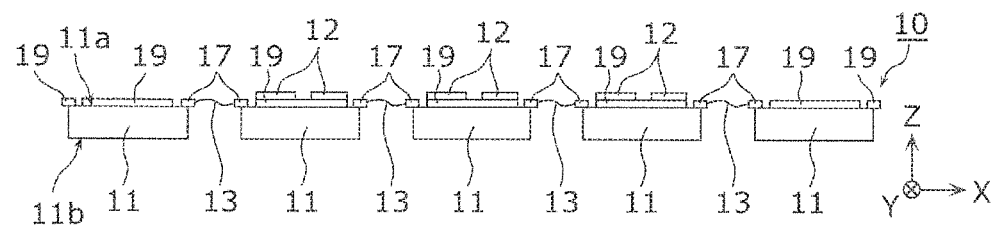
FIG. 1B is a side view of the circuit substrate module according to the embodiment.

Hereinafter, a circuit substrate module according to an embodiment is described with reference to the drawings. FIG. 1A is a plan view of the circuit substrate module according to this embodiment. FIG. 1B is a side view of the circuit substrate module according to this embodiment.

As illustrated in FIGS. 1A and 1B, the circuit substrate module 10 according to this embodiment includes: a plurality of substrates 11; a plurality of first flexible substrates 13; and a plurality of second flexible substrates 14.

The circuit substrate module 10 is a circuit substrate module (circuit substrate device) which can be disposed along a curved surface of a building. The circuit substrate module 10 is used, for example, to drive a display panel (to control emission of pixels), and may also be used for another purpose.

The plurality of substrates 11 are arranged in a matrix, and circuit components 12 are mounted on at least some of the substrates 11. The number of the plurality of substrates 11 provided to the circuit substrate module 10 is fifteen in total obtained according to three lines*five columns, but is not particularly limited.

Each substrate 11 is a rectangular-shaped substrate in a plan view. All of the plurality of substrates 11 provided to the circuit substrate module 10 are of equal size. Since the same substrates 11 are used, it is possible to reduce cost required for the circuit substrate module 10. It is to be noted that the size(s) of some of the substrates 11 may be different from that (those) of the other substrates 11.

Each substrate 11 is formed to be a rigid substrate using a rigid base material having a flexibility lower than those of the first flexible substrates 13 and the second flexible substrates 14. Each substrate 11 may be a composite epoxy material-3 (CEM-3) substrate having a resin as a base material. Each substrate 11, however, may be any other resin substrate, a metal-based substrate, or a ceramic substrate. Examples of other resin substrates include a flame retardant-4 (FR-4) substrate. Examples of other ceramic substrates include an alumina substrate made of an oxide aluminium (alumina) and a nitride aluminium substrate made of nitride aluminium. Examples of other metal-based substrates include an aluminium alloy substrate, an iron alloy substrate, a copper alloy substrate, etc.

Each of the plurality of substrates 11 has a first principal surface 11a, a second principal surface 11b opposite to the first principal surface 11a. The plurality of substrates 11 are arranged in a matrix so that the first principal surfaces 11a are oriented to the same direction (the positive side in the Z axis direction). The circuit substrate module 10 has four substrates 11 in the row direction and three substrates 11 in the column direction.

Circuit components 12 are mounted on the first principal surfaces 11a of at least some of the plurality of substrates 11. Circuit components 12 include a main processor (first integrated circuit element), a sub-processor (second integrated circuit element), a regulator, a resistor, a capacitor, an inductor (coil) etc. The sub-processor is a processor which operates dependently under control of the main processor. The sub-processor may be mounted on the first principal surface 11a of each substrate 11 located around (outside) the substrate 11 on which the main processor is mounted.

The following are also mounted on the first principal surface 11a of the substrate 11: first connectors 17 for connecting the first flexible substrate 13 to the substrate 11; and one or more second connectors 18 for connecting the second flexible substrate 14 to the substrate 11. In addition, the following is also mounted on the first principal surface 11a of some of substrates 11: a third connector 19 for connecting devices such as the display panel disposed outside the circuit substrate module 10 to the circuit substrate module 10. The first connector 17 is disposed at the edge portion of the first principal surface 11a in the X-axis direction, and each second connector 18 is disposed at the edge portion of the first principal surface 11a in the Y-axis direction. The third connector 19 is disposed at each of the substrates 11 located at the both ends in the row direction among the plurality of substrates 11 and at each of the substrates 11 located at the both ends in the column direction among the plurality of substrates 11.

The second principal surface 11b of each of the plurality of substrates 11 is a surface which is made contact with a building when the circuit substrate module 10 is attached to the building. Accordingly, no circuit component is mounted on the second principal surface 11b. It is to be noted that a circuit component 12 or the like may be mounted so as not to prevent the circuit substrate module 10 from being attached to the building.

The substrate 11 is what is called two-layer substrate, and has two wiring layers stacked to sandwich an insulating layer in the Z-axis direction (layer stacking direction). The two wiring layers are made of copper, but may be made of another metal such as silver.

One of the two wiring layers includes at least one first line along the X-axis direction. The first line is electrically connected to a line along the X-axis direction in a later-described first flexible substrate 13 so as to form a first electric path 15. First electric paths 15 are schematically illustrated using broken lines in FIG. 1. Each first electric path 15 extends, in the row direction, from the substrate located at a first end of a row of substrates (the group of four substrates 11 arranged in a row in the example of FIG. 1) to the substrate located at a second end of the row of substrates.

The other one of the two wiring layers includes at least one second line along the Y-axis direction. The second line is electrically connected to a line along the Y-axis direction in a later-described second flexible substrate 14 so as to form a second electric path 16. Second electric paths 16 are schematically illustrated using broken lines in FIG. 1. Each second electric path 16 extends, in the column direction, from the substrate located at a first end of a column of substrates (the group of three substrates 11 arranged in a column in the example of FIG. 1) to the substrate located at a second end of the column of substrates.

The first line and the second line are not electrically connected, and three-dimensionally cross each other in the substrate 11. In other words, the first electric path 15 and the second electric path 16 are not electrically connected, and three-dimensionally cross each other. In this way, it is possible to transmit different signals (or different amounts of electric power) by way of the first electric path 15 and the second electric path 16.

The substrate 11 is not necessarily a two-layer substrate. For example, even if the substrate 11 is a substrate having a single wiring layer, by means of mounting a jumper such as a resistor having a resistance of 0Ω on the first principal surface 11a, it is possible to configure the first line and the second line to three-dimensionally cross each other while maintaining insulation between the first line and the second line.

The first flexible substrate 13 is disposed between two substrates 11 adjacent in the row direction among the plurality of substrates 11, and connects the two adjacent substrates 11. The number of first flexible substrates 13 provided to the circuit substrate module 10 is 12, but is not particularly limited. The first flexible substrate 13 is a rectangular-shaped substrate in a plan view, and is made of a base material which is more flexible (softer) than the substrate 11. The base material of the first flexible substrate 13 is specifically polyimide, kapton, or the like. In other words, the base material functions as an insulating layer.

The first flexible substrate 13 includes a wiring layer sandwiched by components made of a base material in the Z-axis direction (layer staking direction). The wiring layer includes at least one line along the X-axis direction. The wiring layers are made of copper, but may be made of another metal such as silver.

The line included in the first flexible substrate 13 may be a signal line or a power supply line. The signal line is a line for transmitting a control signal output from an element such as an integrated circuit element among the circuit components 12 mounted on the first principal surface 11a of the substrate 11. The signal line specifically includes a data line and a scanning line for performing driving control on the display device. The power supply line is a line for supplying power to integrated circuit elements such as a main processor among the circuit components 12 mounted on the first principal surfaces 11a of the substrates 11. The width of the signal line is narrower than the width of the power supply line on the circuit substrate module 10, but may be approximately the same as or wider than that of the signal line.

The end part of the first flexible substrate 13 on the positive side in the X-axis direction is connected to, for example, a first connector 17 mounted on the edge portion which is of the first principal surface 11a of one substrate 11 and is located on the negative side in the X-axis direction. In addition, the end part of the first flexible substrate 13 on the negative side in the X-axis direction is connected to the first connector 17 mounted on the edge portion which is of the first principal surface 11a of another substrate 11 and is located on the positive side in the X-axis direction. It is to be noted that the substrate 11 and the second flexible substrate 14 may be connected using a connecting structure other than a connector.

The second flexible substrate 14 is disposed between two substrates 11 adjacent in the column direction among the plurality of substrates 11, and connects the two adjacent substrates 11. The number of second flexible substrates 14 provided to the circuit substrate module 10 is ten, but is not particularly limited. The second flexible substrate 14 is a rectangular substrate in a plan view, and is made of a base material which is more flexible (softer) than the substrate 11. The base material of the second flexible substrate 14 is specifically made of polyimide, kapton, or the like.

The second flexible substrate 14 includes a wiring layer sandwiched by base materials in the Z-axis direction (up-down direction). The wiring layer includes at least one line along the Y-axis direction. The wiring layer is made of copper, but may be made of another metal such as silver. The line included in the second flexible substrate 14 may be a signal line or a power supply line.

The end part of the second flexible substrate 14 on the positive side in the Y-axis direction is connected to, for example, a second connector 18 mounted on the edge portion which is of the first principal surface 11a of one substrate 11 and located on the negative side in the Y-axis direction. The end part of the second flexible substrate 14 on the negative side in the Y-axis direction is connected to, for example, a second connector 18 mounted on the edge portion which is of the first principal surface 11a of one substrate 11 and located on the positive side in the Y-axis direction. It is to be noted that the substrate 11 and the second flexible substrate 14 may be connected using a connecting structure other than a connector.

It is to be noted that the second flexible substrate 14 may be substantially the same flexible substrate as the first flexible substrate 13. In this way, it is possible to use the first flexible substrate 13 and the second flexible substrate 14 which are the same, and thereby reducing cost required for the circuit substrate module 10.

The first electric path 15 is formed with first lines respectively provided to substrates in the row of substrates among the plurality of substrates 11 and lines respectively provided to first flexible substrates 13 which connect the substrates in the row of substrates. The first electric path 15 extends, without any gap, from the substrate located at a first end of the row of substrates and the substrate located at a second end of the row of substrates. The first electric path 15 is, for example, electrically connected to a main processor or a sub-processor included in the circuit components 12, and is used to transmit a signal. The first electric path 15 may be used to supply electric power.

The first electric path 15 as such is capable of transmitting a signal (control signal) output by the main processor or the sub-processor included in the circuit components 12 to one and the other end part of the circuit substrate module 10 in the row direction. Accordingly, it is possible to connect the device (target for control by the circuit substrate module 10) which is a signal transmission destination to the one or the other end part of the circuit substrate module 10 in the row direction.

At least one such first electric path 15 is disposed to each of rows of substrates. In other words, each row of substrates in the circuit substrate module 10 forms the at least one first electric path 15. When the number of rows in the matrix arrangement of the plurality of substrates 11 is three as in the circuit substrate module 10, the circuit substrate module 10 includes at least three first electric paths 15. It is to be noted that two or more first electric paths 15 may be arranged for each row of substrates.

The second electric path 16 is formed with second lines respectively provided to the substrates in the column of substrates among the plurality of substrates 11 and lines respectively provided to second flexible substrates 14 which connect the substrates in the column of substrates. The second electric path 16 extends, without any gap, from the substrate located at a first end of the column of substrates and the substrate located at a second end of the column of substrates. The second electric path 16 is, for example, electrically connected to a main processor or a sub-processor included in the circuit components 12, and is used to transmit a signal. The second electric path 16 may be used to supply electric power. It is to be noted that one of the first electric path 15 and the second electric path 16 may be used to transmit a signal, and the other one may be used to supply electric power. Both of the first electric path 15 and the second electric path 16 may be used to supply electric power.

The second electric path 16 as such is capable of transmitting a signal (control signal) output by the main processor or the sub-processor included in the circuit components 12 to one and the other end part of the circuit substrate module 10 in the column direction. Accordingly, it is possible to connect the device (target for control by the circuit substrate module 10) which is a signal transmission destination to the one and the other end part of the circuit substrate module 10 in the column direction.

At least one such second electric path 16 is disposed to each of columns of substrates. In other words, each column of substrates in the circuit substrate module 10 forms the at least one second electric path 16. When the number of columns in the matrix arrangement of the plurality of substrates 11 is five as in the circuit substrate module 10, the circuit substrate module 10 includes at least five second electric paths 16. It is to be noted that two or more second electric paths 16 may be arranged for each column of substrates.

[Function of Circuit Substrate Module]

Figure 2A:
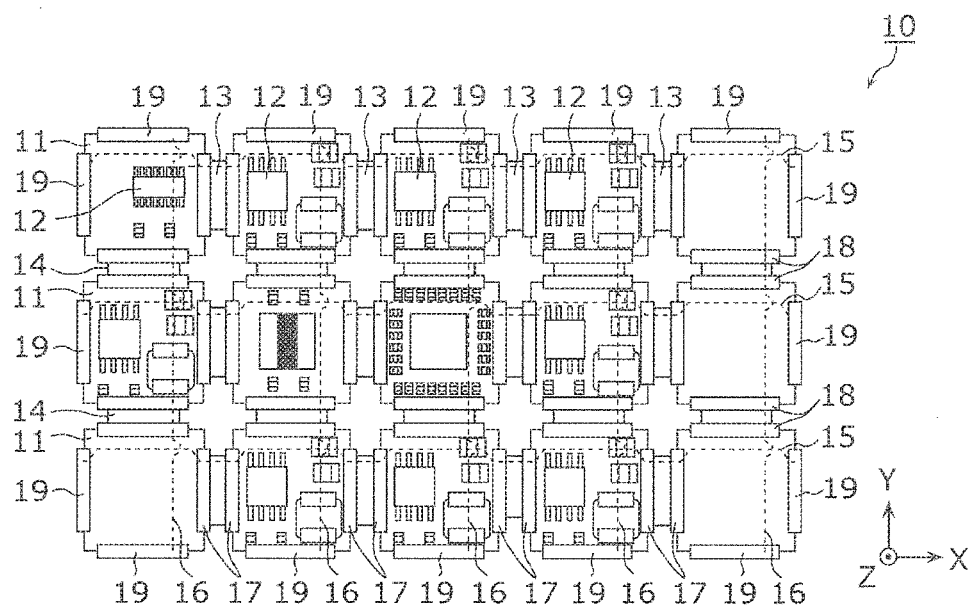
FIG. 2A is a plan view of the circuit substrate module when first flexible substrates and second flexible substrates are bent.
Figure 2B:
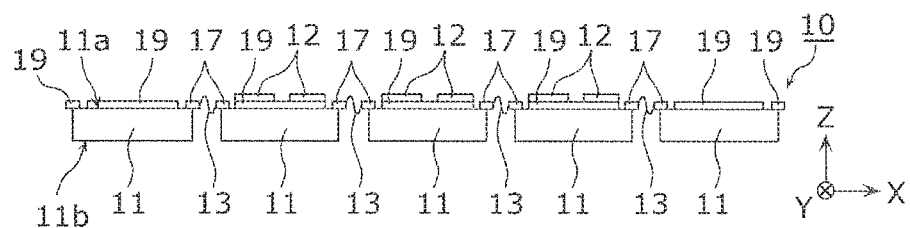
FIG. 2B is a side view of the circuit substrate module when the first flexible substrates and the second flexible substrates are bent.

The circuit substrate module 10 includes the plurality of substrates 11 connected by the plurality of first flexible substrates 13 and the plurality of second flexible substrates 14. Here, the first flexible substrates 13 and the second flexible substrates 14 can be freely bent (are flexible) as illustrated in FIGS. 2A and 2B. FIG. 2A is a plan view of the circuit substrate module 10 when the first flexible substrates 13 and the second flexible substrates 14 are bent. FIG. 2B is a side view of the circuit substrate module 10 when the first flexible substrates 13 and the second flexible substrates 14 are bent.

The circuit substrate module 10 can be disposed, for example, along a curved surface (specifically, a sphere) of a building 50 as illustrated in FIG. 3, making the use of the fact that the first flexible substrates 13 and the second flexible substrates 14 can be freely bent. FIG. 3 is a diagram illustrating the circuit substrate module 10 disposed along the curved surface (specifically, the sphere) of the building 50.

[Display Device with Circuit Substrate Module]

Figure 4:
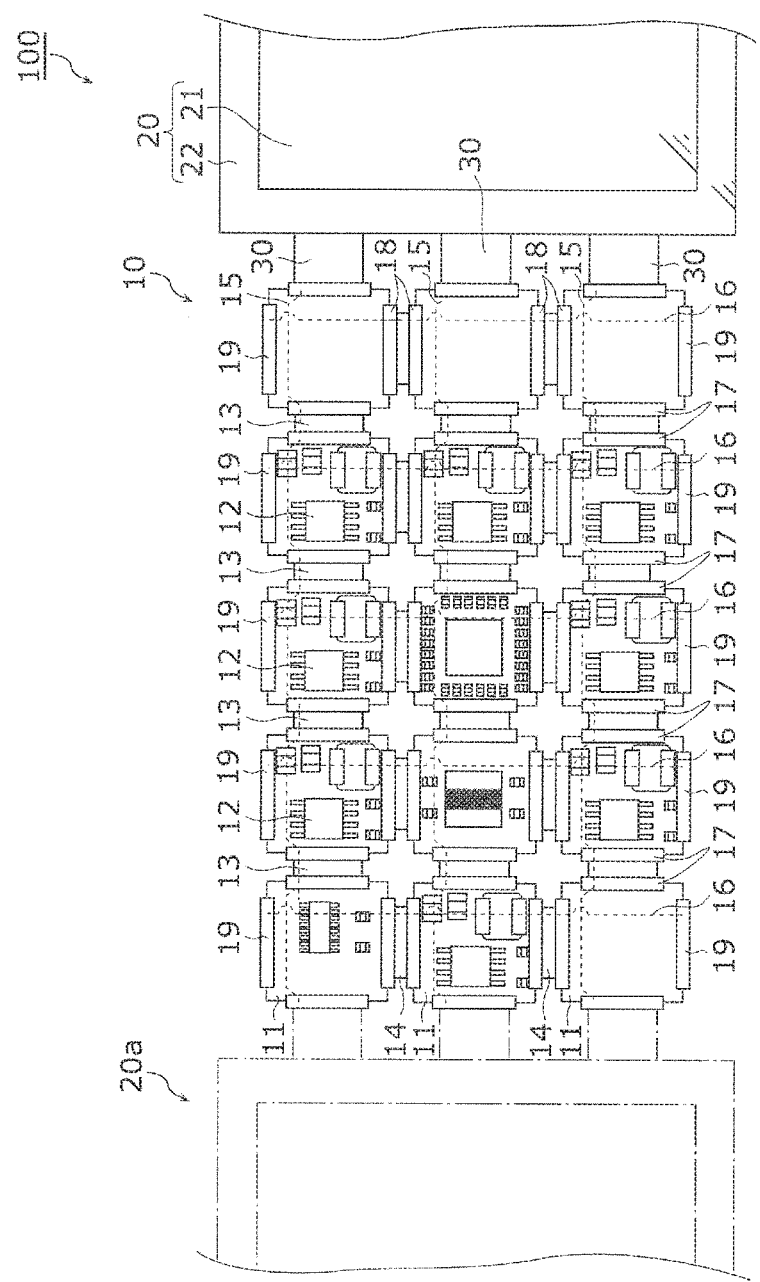
FIG. 4 is a plan view of a flexible display device according to the embodiment.

The circuit substrate module 10 is used for a flexible display device or the like. Hereinafter, a description is given of the flexible display device provided to the circuit substrate module 10. FIG. 4 is a plan view of the flexible display device.

As illustrated in FIG. 4, the flexible display device 100 includes: the circuit substrate module 10; a flexible display panel 20; and a plurality of third flexible substrates 30.

The flexible display device 100 is a display device which can be disposed along the curved surface (specifically, the sphere) of the building 50. The flexible display device 100 is a display device of an active matrix type having a plurality of pixels arranged in a matrix. The flexible display device 100 specifically includes the flexible display panel 20 which has the plurality of pixels. The flexible display panel 20 is controlled by the circuit substrate module 10. In other words, light emission by the plurality of pixels is controlled by the circuit substrate module 10.

The flexible display panel 20 is a thin flexible display, and is specifically an organic EL panel. The flexible display panel 20 includes a pixel part 21 and a wiring part 22. The flexible display panel 20 is rectangular in a plan view.

The pixel part 21 includes a plurality of light-emitting pixels arranged in a matrix. The plurality of light-emitting pixels are composed of pixels which emit red (R) light, pixels which emit green (G) light, and pixels which emit blue (B) light. Each light-emitting pixel includes a pixel circuit with a thin film transistor (TFT). In addition, the pixel part 21 includes: power supply lines which supply a driving current to light-emitting pixels; scanning lines which are signal lines provided in the rows of light-emitting pixels; and data lines which are signal lines provided in the columns of light-emitting pixels. The power supply lines and the signal lines (data lines and scanning lines) extend beyond the outer periphery of the flexible display panel 20 to form the wiring part 22.

The wiring part 22 is a part in which the power source lines and signal lines which extend from the pixel part 21 are densely provided, and is used for electrical connection with the circuit substrate module 10. The wiring part 22 has a frame shape and surrounds the pixel part 21.

The third flexible substrate 30 is a rectangular substrate in a plan view, and is made of a base material which is more flexible (softer) than the substrate 11. The base material of the third flexible substrate 30 is specifically polyimide, kapton, or the like. In other words, the base material functions as an insulating layer.

The third flexible substrate 30 electrically connects the circuit substrate module 10 and the flexible display panel 20. One of the end parts of the third flexible substrate 30 is connected to the third connector 19, and the other end part of the third flexible substrate 30 is connected to the wiring part 22 of the flexible display panel 20. It is to be noted that, in the example of FIG. 4, the third flexible substrate 30 is connected to the end part of the circuit substrate module 10 on the positive side in the X-axis direction. In other words, the flexible display panel 20 is connected to the end part of the circuit substrate module 10 on the positive side in the X-axis direction. It is to be noted that the third flexible substrate 30 may be configured to have a chip-on-film structure on which an integrated circuit element is mounted.

The flexible display device 100 as such can be disposed along the whole curved surface of the flexible display device 100 because each of the circuit substrate module 10 and the flexible display panel 20 is flexible.

In addition, the flexible display device 100 may include another flexible display panel 20a as illustrated by alternate long and short dashed lines in FIG. 4. For example, the flexible display panel 20a is connected to the end part of the circuit substrate module 10 on the negative side in the X-axis direction.

In this way, when a signal (control signal) output by the main processor or the sub-processor is transmitted by the first electric path 15 provided to the circuit substrate module 10, it is possible to supply the same signal to the flexible display panel 20 and the flexible display panel 20a. In other words, it is possible to display the same image on the flexible display panel 20 and the flexible display panel 20a.

It is to be noted that this applies to a case where the flexible display panel 20 is connected to the end part of the circuit substrate module 10 on the positive side in the Y-axis direction, and the flexible display panel 20a is connected to the end part of the circuit substrate module 10 on the negative side in the Y-axis direction. In this case, when a signal (control signal) output by the main processor or the sub-processor is transmitted by the second electric path 16 provided to the circuit substrate module 10, it is possible to supply the same signal to the flexible display panel 20 and the flexible display panel 20a. In other words, it is possible to display the same image on the flexible display panel 20 and the flexible display panel 20a.

[Effects]

As described above, the circuit substrate module 10 includes: a plurality of substrates 11 which are arranged in a matrix, and on at least some of which circuit components 12 are mounted; a plurality of first flexible substrates 13 each of which is arranged between two adjacent substrates 11 in a row direction among the plurality of substrates 11, and connects the two adjacent substrates 11; and a plurality of second flexible substrates 14 each of which is arranged between two adjacent substrates 11 in a column direction among the plurality of substrates 11, and connects the two adjacent substrates 11. In each row of substrates among the plurality of substrates, a plurality of first lines respectively provided to substrates 11 in the row of substrates 11 and a plurality of lines respectively provided to first flexible substrates 13 which connect the substrates 11 in the row of substrates 11 form a first electric path 15 which extends from a substrate 11 located at a first end of the row of substrates 11 to a substrate 11 located at a second end of the row of substrates 11. In addition, in each column of substrates 11 among the plurality of substrates 11, a plurality of second lines respectively provided to substrates 11 in the column of substrates 11 and a plurality of lines respectively provided to second flexible substrates 14 which connect the substrates 11 in the column of substrates 11 form a second electric path 16 which extends from a substrate 11 located at a first end of the column of substrates 11 to a substrate 11 located at a second end of the column of substrates 11.

In this way, the circuit substrate module 10 can be disposed, for example, along a curved surface (specifically, a sphere) of a building 50, making the use of the fact that the first flexible substrates 13 and the second flexible substrates 14 can be freely bent. In addition, it is possible to transmit a signal or electric power from the first end part to the second end part of the circuit substrate module 10 by using the first electric path 15 and the second electric path 16.

In addition, the first electric path 15 and the second electric path 16 may be used to transmit a signal.

In this way, it is possible to transmit the signal from the first end parts to the second end part of the circuit substrate module 10 by using the first electric path 15 and the second electric path 16.

In addition, the plurality of substrates may be of equal size.

In this way, since the same substrates 11 are used, it is possible to reduce cost required for the circuit substrate module 10.

In addition, the first electric path 15 and the second electric path 16 three-dimensionally cross each other.

In this way, it is possible to transmit different signals by way of the first electric path 15 and the second electric path 16.

Each of the plurality of substrates 11 may have a first principal surface 11a and a second principal surface 11b opposite to the first principal surface 11a. The plurality of substrates 11 are arranged in the matrix in such a manner that first principal surfaces 11a of the respective substrates 11 are oriented in a same direction, the circuit components 12 are mounted on the first principal surfaces 11a of the at least some of the plurality of substrates 11, and the circuit component 12 is not mounted on the second principal surface 11b of each of the plurality of substrates 11.

In this way, the second principal surface 11b can be disposed along and in close vicinity to the building 50.

In addition, the flexible display device 100 includes: the circuit substrate module 10; and a flexible display panel 20 including a plurality of pixels which are arranged in a matrix and whose light emission is controlled by the circuit substrate module 10.

The flexible display device 100 as such can be disposed along the whole curved surface of the flexible display device 100 because each of the circuit substrate module 10 and the flexible display panel 20 is flexible.

CONCLUSION

The embodiment has been described above as an example of a technique disclosed in the present application. However, the technique in the present disclosure is not limited to the embodiment, and is applicable to embodiments obtained by arbitrarily performing modification, replacement, addition, omission, and/or the like. It is also possible to create new embodiments by arbitrarily combining the constituent elements described in the above embodiment.

The constituent elements described in the attached drawings and the Description of Embodiment include not only the constituent elements which are essential to solve the problem but also constituent elements which are inessential to solve the problem. Therefore, the inessential constituent elements should not be interpreted as essential constituent elements directly because these inessential constituent elements are described in the attached drawings or the Description of Embodiment.

Since the above-described embodiment is provided to illustrate the technique in the present disclosure, it is possible to perform various kinds of modification, replacement, addition, omission, and/or the like within the scope of the claims and the equivalents thereof.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

A flexible display device according to the present disclosure can be used as a display device having a flexible display panel, and particularly as a flexible display device such as a television and a personal computer.

The invention claimed is:

1. A circuit substrate module included in a single display device having a single screen, the circuit substrate module comprising:
   a plurality of substrates which are arranged in a matrix, and on at least some of which circuit components are mounted;
   a plurality of first flexible substrates, each of which is arranged between two adjacent substrates in a row direction among the plurality of substrates, and connects the two adjacent substrates in the row direction; and
   a plurality of second flexible substrates, each of which is arranged between two adjacent substrates in a column direction among the plurality of substrates, and connects the two adjacent substrates in the column direction,
   wherein, in each row of substrates among the plurality of substrates, a plurality of lines respectively provided to substrates in the row of substrates and a plurality of lines respectively provided to first flexible substrates which connect the substrates in the row of substrates form a first electric path which extends from a substrate located at a first end of the row of substrates to a substrate located at a second end of the row of substrates, and
   in each column of substrates among the plurality of substrates, a plurality of lines respectively provided to substrates in the column of substrates and a plurality of lines respectively provided to second flexible substrates which connect the substrates in the column of substrates form a second electric path which extends from a substrate located at a first end of the column of substrates to a substrate located at a second end of the column of substrates, each of the plurality of substrates, the plurality of first flexible substrates, and the plurality of second flexible substrates are disposed within the single display device having the single screen, and each of the plurality of substrates does not include a display.

2. The circuit substrate module according to claim 1, wherein the first electric path and the second electric path are used to transmit a signal.

3. The circuit substrate module according to claim 1, wherein the plurality of substrates are of equal size.

4. The circuit substrate module according to claim 1, wherein the first electric path and the second electric path three-dimensionally cross each other.

5. The circuit substrate module according to claim 1, wherein each of the plurality of substrates has a first principal surface and a second principal surface opposite to the first principal surface, the plurality of substrates are arranged in the matrix in such a manner that first principal surfaces of the respective substrates are oriented in a same direction, the circuit components are mounted on the first principal surfaces of the at least some of the plurality of substrates, and no circuit component is mounted on the second principal surface of each of the plurality of substrates.

6. A flexible display device, comprising:
the circuit substrate module according to claim 1; and
a flexible display panel including a plurality of pixels which are arranged in a matrix and whose light emission is controlled by the circuit substrate module.

7. A circuit substrate module included in a single display device having a single screen, the circuit substrate module comprising:

a plurality of substrates which are arranged in a matrix, and on at least some of which circuit components are mounted;

a plurality of first flexible substrates, each of which is arranged between two adjacent substrates in a row direction among the plurality of substrates, and connects the two adjacent substrates in the row direction; and a plurality of second flexible substrates, each of which is arranged between two adjacent substrates in a column direction among the plurality of substrates, and connects the two adjacent substrates in the column direction, wherein, in each row of substrates among the plurality of substrates, a plurality of lines respectively provided to substrates in the row of substrates and a plurality of lines respectively provided to first flexible substrates which connect the substrates in the row of substrates form a first electric path which extends from a substrate located at a first end of the row of substrates to a substrate located at a second end of the row of substrates, in each column of substrates among the plurality of substrates, a plurality of lines respectively provided to substrates in the column of substrates and a plurality of lines respectively provided to second flexible substrates which connect the substrates in the column of substrates form a second electric path which extends from a substrate located at a first end of the column of substrates to a substrate located at a second end of the column of substrates, each of the plurality of substrates, the plurality of first flexible substrates, and the plurality of second flexible substrates are disposed within the single display device having the single screen, and a portion of each of the flexible substrates overlaps a portion of a top surface of the substrates.

* * * * *